(12) United States Patent
Yoshida et al.

(10) Patent No.: US 6,696,784 B2
(45) Date of Patent: Feb. 24, 2004

(54) LIGHT EMITTING DIODE MODULE

(75) Inventors: Minoru Yoshida, Osaka (JP); Haruo Matsumoto, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 450 days.

(21) Appl. No.: 09/751,209

(22) Filed: Dec. 29, 2000

(65) Prior Publication Data

US 2001/0007360 A1 Jul. 12, 2001

(30) Foreign Application Priority Data

Jan. 7, 2000 (JP) ........................................ 2000-001447

(51) Int. Cl.[7] .............................................. H01L 33/00
(52) U.S. Cl. ........................ 313/498; 313/500; 362/800
(58) Field of Search ................................ 313/498, 500; 257/88, 89, E25.02; 315/167, 168, 363, 169.1–169.3; 362/800

(56) References Cited

U.S. PATENT DOCUMENTS 6,069,365 A * 5/2000 Chow et al. ................. 250/551
6,297,598 B1 * 10/2001 Wang et al. .............. 315/169.3

* cited by examiner

*Primary Examiner*—Jay Patidar
(74) *Attorney, Agent, or Firm*—RatnerPrestia

(57) ABSTRACT

A compact LED module capable of preventing electrostatic destruction is provided. This LED module has first, second, and third terminals; first and second light emitting diodes connected between the first and second terminals and also connected in inverse parallel to each other; and a third light emitting diode connected between the first or second terminal and the third terminal. The first light emitting diode is a green light emitting diode, the second light emitting diode is a blue light emitting diode, and the third light emitting diode is a red light emitting diode.

6 Claims, 6 Drawing Sheets

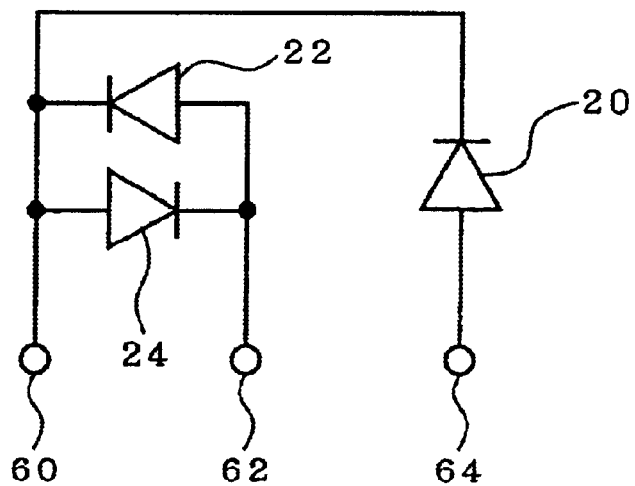
F I G . 5

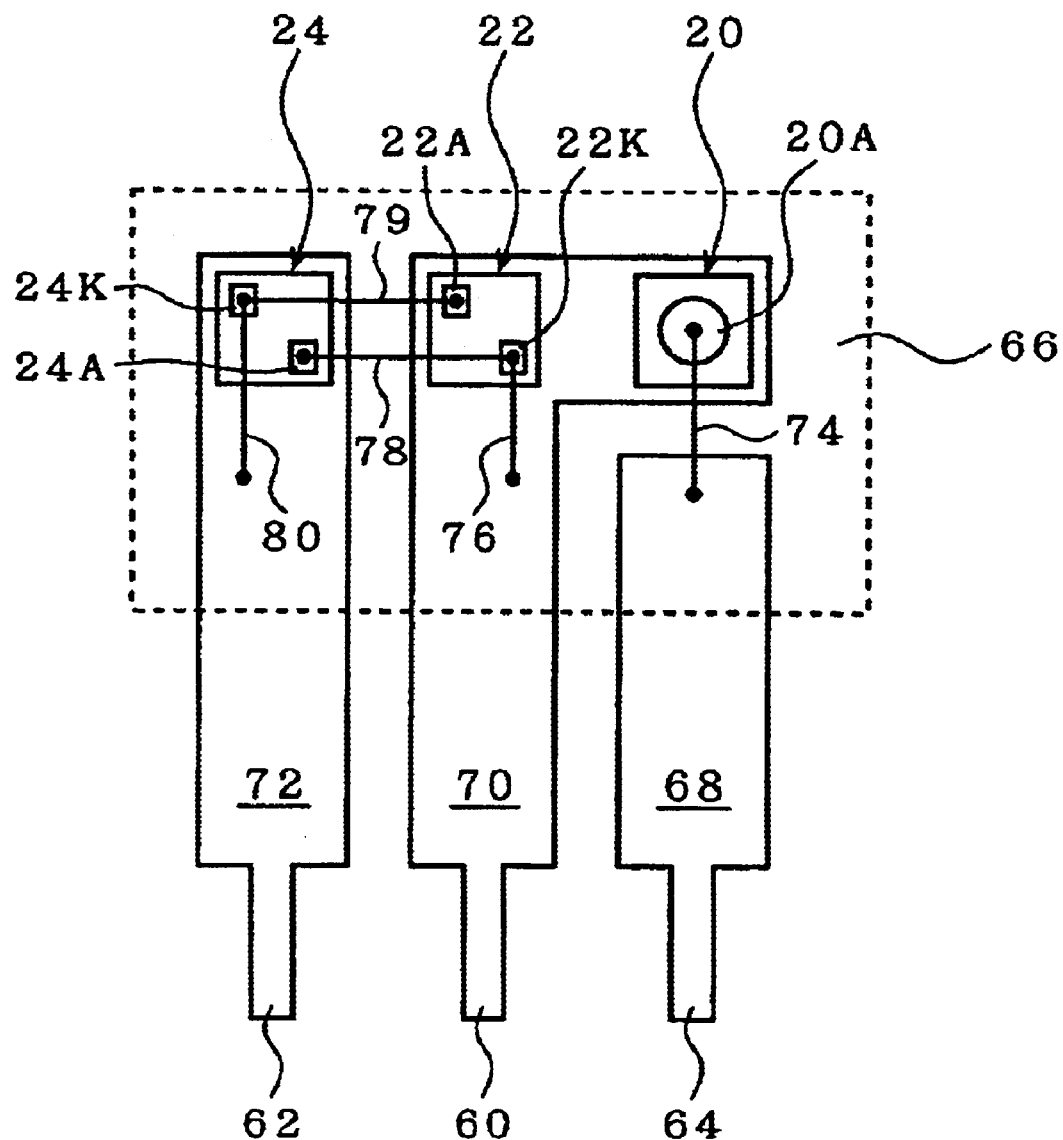
F I G. 6

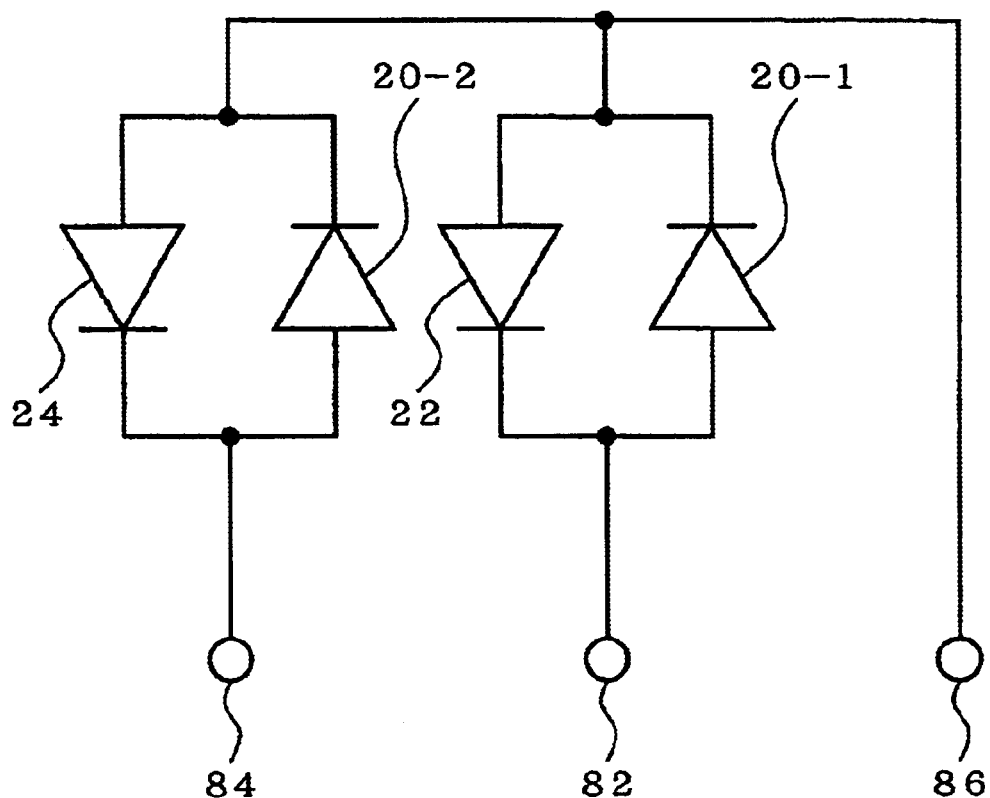
F I G . 7

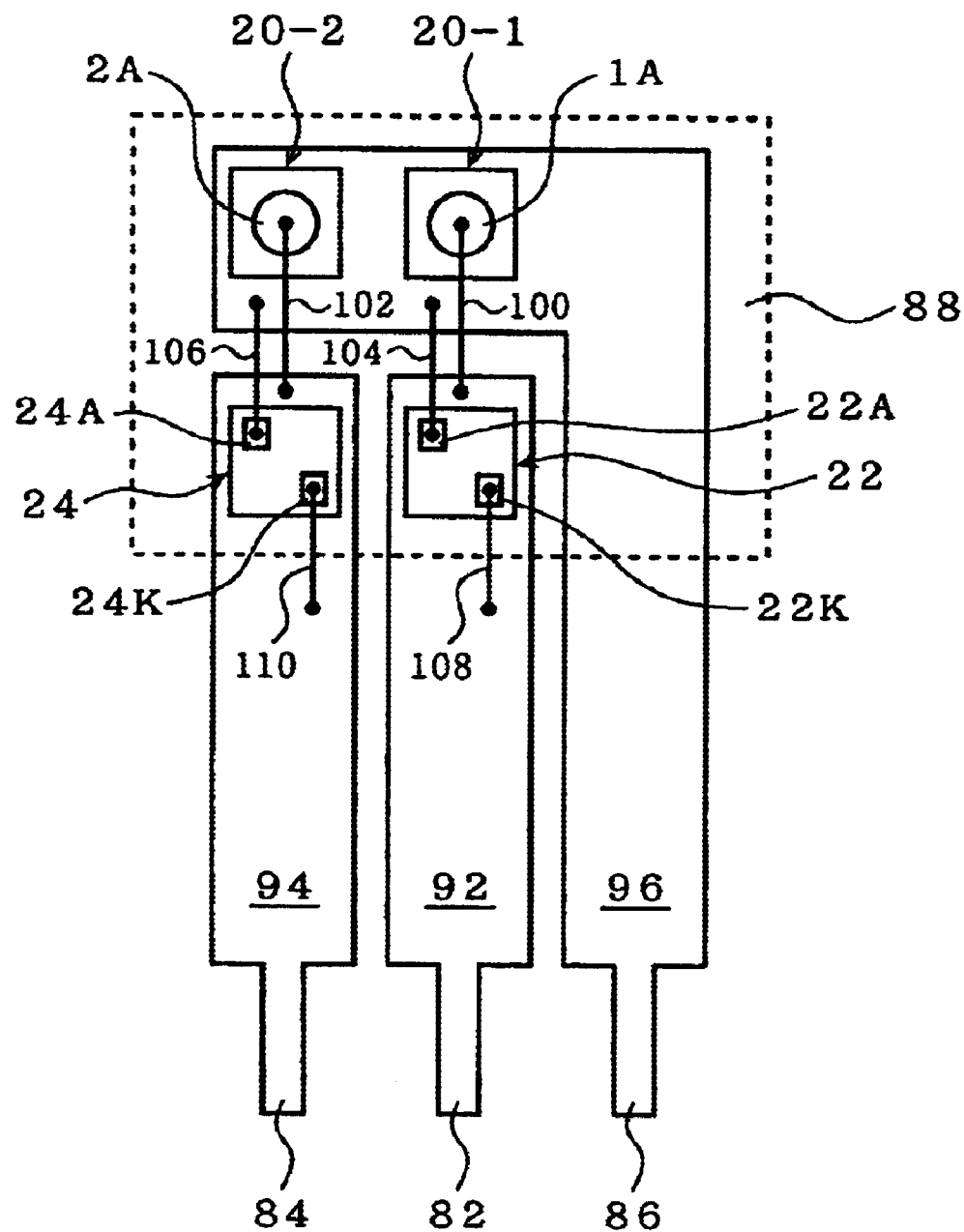
F I G. 8

LIGHT EMITTING DIODE MODULE

FIELD OF THE INVENTION

The present invention relates to a light emitting diode module as a compact light source for a lighting unit incorporated in a contact image sensor type of image reader. More specifically, this invention relates to a light emitting diode module having the configuration capable of preventing destruction by static electricity.

BACKGROUND OF THE INVENTION

In a contact image sensor type of image reader used, for instance, in a facsimile terminal equipment, a copying machine, or a scanner, a light emitting diode (described as LED hereinafter) is used as a compact light source for a linear lighting unit to emit light in a linear state to a surface of a document. An example of the linear lighting unit based on the conventional technology is disclosed in Japanese Patent Laid-open Publication No. 8-163320. As shown in FIG. 1, the linear lighting unit described in this publication incorporates therein a light conductor 14 within a white casing 12 for a linear lighting unit 10, and an LED module 16 comprising a plurality of LEDs is attached to a package having a form like a flat plate at one edge of the light conductor 14.

A full-color image reader often uses, as a linear lighting unit thereof, an LED module in which LEDS for three colors of red, green, and blue (R, G, B) are sequentially lighted up. Generally the LED module is a 4-terminal module in which a cathode and an anode of each LED are connected to individual terminals respectively and at the same time the anode and cathode are commonly connected to the respective common terminals.

FIG. 2 shows a connection diagram of a 4-terminal module. In the figure, designated at the reference numeral 20 is a red LED, at 22 a green LED, and at 24 a blue LED, and anodes of the LEDs are connected to terminals 26, 28, 30 respectively, while cathodes of the LEDs are commonly connected to a terminal 32.

Typically the red LED 20 has a conductive substrate, and a cathode or anode electrode is provided on a rear surface of the substrate, namely on a rear surface of the chip, while the anode or cathode electrode is provided on a top surface of the chip. The green LED and blue LED have an insulating substrate, and in many cases an node electrode and a cathode electrode are provided on a top surface of the chip. Because of the configuration described above, the connection with the anode connected to a common terminal as shown in FIG. 2 is implemented as shown in FIG. 3 in actual wiring.

In FIG. 3, packaged in a flat plate-formed package 34 (indicated by the dotted line) are lead frames 36, 38, 40 having individual terminals 26, 28, 30 shown in FIG. 2 at one edges respectively and a lead frame 42 having a common terminal 32 at one edge thereof. The red LED 20 is provided on the lead frame 36, the greed LED 22 on the lead frame 38, and the blue LED 24 on the lead frame 40.

The red LED 20 has an anode electrode 20A provided on a top surface of the chip and a cathode electrode (not shown) on a rear surface of the chip; the green LED 22 has an anode electrode 22A and a cathode electrode 22K both provided on a top surface of the chip; and the blue LED 22 has an anode electrode 24A and a cathode electrode 24K both provided on a top surface of the chip.

A cathode electrode of the read LED 20 is directly connected to the lead frame 36; the cathode electrode 22K of the green LED 22 is connected via a bonding wire 48 to the lead frame 38; and the cathode electrode 24K of the blue LED 24 is connected via a bonding wire 50 to the read frame 40.

The anode electrode 20A of the red LED 20, anode electrode 22A of the green LED 22, and anode electrode 24A of the blue LED 24 are connected via bonding wires 52, 54, and 56 respectively to the common lead frame 42.

It is generally known that an LED is disadvantageously vulnerable to a surge voltage caused by discharge of static electricity. When the terminal is connected, the LED may be destructed by a current higher than the rated one flowing in the reverse direction even for a very short period of time. It is generally recognized that especially the green LED and blue LED based on the conventional technology are more vulnerable to destruction caused by static electricity as compared to the red LED. For the purpose to prevent destruction by a surge voltage, load of a high voltage to an LED due to electrostatic discharge, generally a Zener diode is connected in parallel as shown in FIG. 4 to the LED or a Zener diode is provided on a substrate to which the LED module is connected to prevent a high voltage due to electrostatic discharge from being loaded to the LED.

However, when it is tried to incorporate a Zener diode in an LED module, a number of steps for packaging the chip not directly relating to the light emitting function into the module increases, which in turn causes disadvantageous problems such as the difficulty in size reduction of the module and increase in the production cost. Further, when a Zener diode is to be packaged on a substrate, the LED module may directly be affected by electrostatic discharge in the state where the terminal is connected until the LED module is packaged on the substrate, and it is required to take appropriate countermeasures for suppressing generation of static electricity in the peripheral environment.

SUMMARY OF THE INVENTION

It is an object of the present invention to provide a compact LED module capable of preventing destruction due to static electricity without using a Zener diode and requiring few countermeasures against static electricity in the peripheral environment.

In a first aspect of the present invention, the light emitting diode as a compact light source for a lighting unit has first, second, and third terminals; first and second light emitting diodes connected between the first and second terminals and also connected in inverse parallel to each other; and a third light emitting diode connected between the first or second terminal and the third terminal.

In this LED module, it is preferable that the first light emitting diode is a green light emitting diode, the second light emitting diode is a blue light emitting diode, and the third light emitting diode is a red light emitting diode.

In a second aspect of the present invention, the light emitting diode as a compact light source for a lighting unit has first, second, and third terminals; first and second light emitting diodes connected between the first and second terminals and also connected in parallelism to each other; and third and fourth light emitting diodes connected between the second and third terminals and also connected in inverse parallel to each other.

In this LED module, it is preferable that the first light emitting diode is a green light emitting diode, the third light emitting diode is a blue light emitting diode, and the second and fourth light emitting diodes are red light emitting diodes.

BRIEF DESCRIPTION OF THE DRAWINGS

FIG. 5 is a view showing connection in an LED module according to an embodiment of the present invention;

FIG. 6 is a view showing wiring in the LED module shown in FIG. 5;

FIG. 7 is a view showing connection in an LED module according to another embodiment of the present invention; and FIG. 8 is a view showing wiring in the LED module shown in FIG. 7.

DETAILED DESCRIPTION OF A PREFERRED EMBODIMENT

Figure 1:
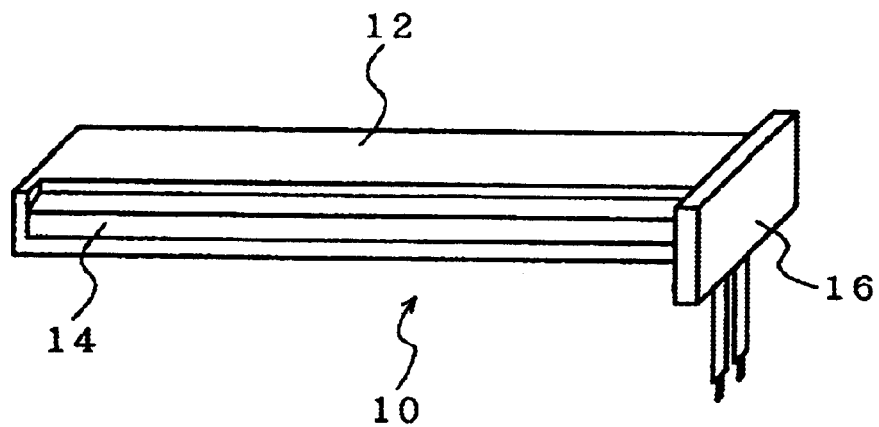
FIG. 1 is a view showing a conventional type of linear lighting unit.

An embodiment of the present invention is described in detail below with reference to FIG. 5 and FIG. 6. FIG. 5 is a view showing connection in an LED module according to an embodiment of the present invention. FIG. 6 is a view showing wiring in the LED module shown in FIG. 5.

The red LED 20, green LED 22, and blue LED 24 each constituting this LED module are connected to each other as shown in the connection diagram in FIG. 5. Namely the green LED 22 and blue LED 24 are connected in parallel to each other with polarities thereof reverse to each other (so-called inverse parallel connection), a cathode of the green LED 22 and an anode of the blue LED 24 are connected to a terminal 60, and an anode of the green LED 22 and a cathode of the blue LED 24 are connected to a terminal 62. A cathode of the red LED 20 is connected to a terminal 60, while an anode thereof is connected to a terminal 64.

In the specific wiring shown in FIG. 6, packaged in a flat plate type of package 66 are three lead frames 70, 72, 68 having terminals 60, 62, 64 at the edges respectively. The red LED 20 and green LED 22 are provided on the lead frame 70, and the blue LED 24 is provided on the lead frame 72.

The anode electrode 20A of the red LED 20 is connected via a bonding wire 74 to the lead frame 68, the cathode electrode 22K of the green LED 22 is connected via a bonding wire 76 to the lead frame 70, and also is connected via a bonding wire 78 to the anode electrode 24A of the blue LED 24. The anode electrode 22A of the green LED 22 is connected via a bonding wire 79 to the cathode electrode 24K of the blue LED 24, and the cathode electrode 24K is connected via a bonding wire 80 to the lead frame 72.

Figure 2:
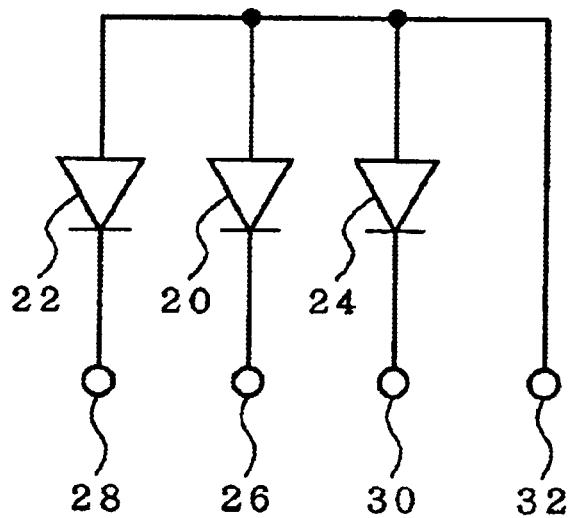
FIG. 2 is a view showing connection in a conventional type of LED module.
Figure 3:
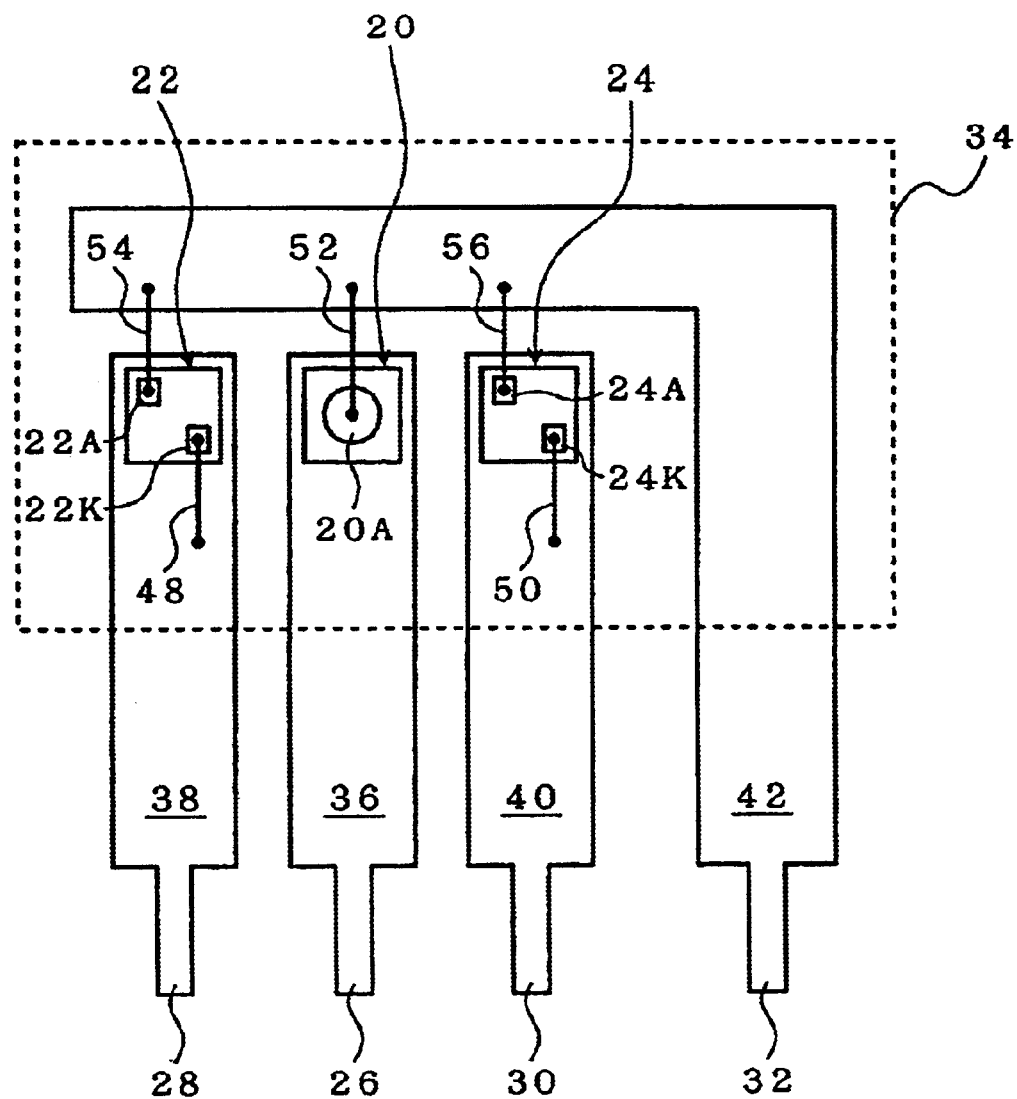
FIG. 3 is a view showing wiring in the conventional type of LED.
Figure 4:
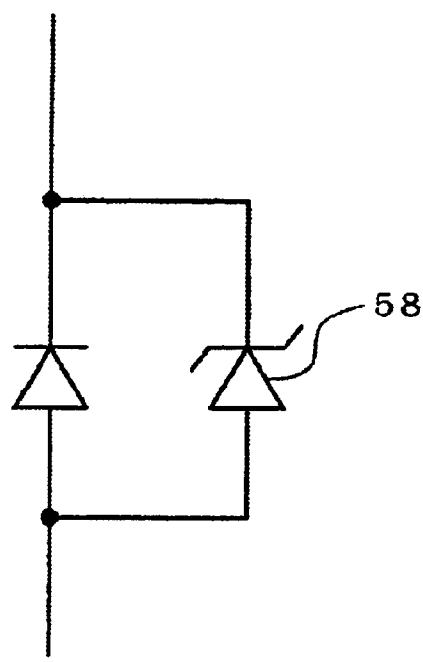
FIG. 4 is a view showing a conventional type of surge voltage prevention circuit.

The LED module in this embodiment has three terminals, and does not require the conventional common terminal 32 shown in FIG. 2 and FIG. 3. Further the packaging area is reduced, which in turn enables size reduction of an LED module.

The LEDS for the three colors in the 3-terminal LED module described above can be lighted up by loading a voltage with prespecified polarity to each terminal as shown in Table 1.

TABLE 1

|  | Terminal 60 | Terminal 62 | Terminal 64 |
| --- | --- | --- | --- |
| Blue LED | + | − | + |
| Green LED | − | + | − |
| Red LED | − | − | + |

As shown in Table 1, when a voltage is loaded so that the terminal 62 is set in −polarity, the terminal 62 in −polarity, and the terminal 64 in +polarity, a forward voltage is loaded only to the blue LED 24, and the blue LED 24 is lighted up. In this step, a reverse voltage is loaded to the green LED 22 connected in parallel to the blue LED 24, but the voltage is at around the built-in potential in the pn junction, and never destructs the LED.

In the LED module in which the components are connected as described above, when a surge voltage caused by electrostatic discharge is loaded between the terminal 60 and terminal 62 so that the terminal 62 is set in a positive voltage, a current flows to the green LED 22 which is in the forward direction to the surge voltage, so that a high reverse-directional voltage is prevented from being loaded to the blue LED 24, thus the LED module being protected from destruction. On the contrary, when a surge voltage is loaded to the terminal 60 to be set in a positive voltage, a current flows to the blue LED 24 which is in the forward direction to the surge voltage, so that a high reverse-directional voltage is prevented from being loaded to the green LED 22, thus the LED module being protected from destruction.

Further when a surge voltage is loaded between the terminal 64 and terminal 62 so that the terminal 62 is set in a positive voltage, a current flows to the green LED 22 which is in the forward direction to the surge voltage, so that the blue LED 24 is protected from destruction as described above. In this step, although a reverse-directional voltage is loaded to the red LED 20, as durability of the red LED against electrostatic destruction is generally higher as compared to the green and blue LEDs, so that destruction of the red LED never occurs. On the contrary, when a surge voltage is loaded to the terminal 64 to be set in a positive voltage, a current flows to the red LED 20 and blue LED 24 which are in the forward direction to the surge voltage, so that a high reverse-directional voltage is prevented from being loaded to the green LED 22, thus the LED module being protected from destruction.

When a surge voltage is loaded between the terminals 60 and 64, this surge voltage is directly loaded to the red LED 20, so that the performance of the LED module as a whole is decided by the red LED's durability against electrostatic destruction.

Another embodiment of the present invention is described in detail below with reference to FIG. 7 and FIG. 8. FIG. 7 is a view showing connection in an LED module according to another embodiment of the present invention. FIG. 8 is a view showing the actual wiring in the LED module shown in FIG. 7.

In this LED module, as shown in FIG. 7, a red LED 20-1 and the green LED 22 are connected in inverse parallel to each other, while a red LED 20-2 and the blue LED 24 are connected in inverse parallel to each other. An anode of the red LED 20-1 and a cathode of the green LED 22 are connected to a terminal 82; an anode of the read LED 20-2 and a cathode of the blue LED 24 are connected to a terminal 84; and a cathode of the red LED 20-1, a cathode of the green LED 22, a cathode of the red LED 20-2, and an anode of the blue LED 24 are connected to a terminal 86.

In the actual wiring shown in FIG. 8, packaged in the flat plate type of package 88 are three lead frames 92, 94, 96 having the terminals 82, 84, 86 at the edges thereof respectively. The red LEDs 20-1, 20-2 are provided on the lead frame 96; the green LED 22 is provided on the lead frame 92; and the blue LED 24 is provided on the lead frame 94.

The anode electrode 1A of the red LED 20-1 is connected via a bonding wire 100 to the lead frame 92, and the anode electrode 2A of the red LED 20-2 is connected via a bonding wire 102 to the lead frame 94.

The anode electrode 22A of the green LED 22 is connected via a bonding wire 104 to the lead frame 96, and the anode electrode 24A of the blue LED 24 is connected via a bonding wire 106 to the lead frame 94.

The cathode electrode 22K of the green LED 22 is connected via a bonding wire 108 to the lead frame 92, and the cathode electrode 24K of the blue LED 24 is connected via a bonding wire 110 to the lead frame 94.

With the wiring as described above, the common terminal can be eliminated with the packaging area reduced, so that side reduction of the LED module is possible.

In this LED module, two pieces of red LED are required, and the connection allowing the two LEDs to be lighted up simultaneously is effective when brightness of the red LED is lower as compared to the green and blue LEDs.

The LEDS for the three colors in the 3-terminal LED module as described above can be lighted up by loading a voltage having the polarity as shown in Table 1 below to each terminal.

TABLE 2

|  | Terminal 84 | Terminal 82 | Terminal 86 |
|---|---|---|---|
| Blue LED | − | + | + |
| Green LED | + | − | + |
| Red LED | + | + | − |

As shown in Table 2, for instance, when a voltage is loaded so that the terminal 84 is set in +polarity, the terminal 82 in +polarity, and the terminal 86 in +polarity, a forward voltage is loaded only to the blue LED 24, so that the blue LED 24 is lighted up.

With the LED module having the connection as described above, even when a surge voltage with either polarity is loaded between the terminals 84, 86, between the terminals 82, 86, or between the terminals 82, 84, there is always an LED connected to the forward direction to the surge voltage, so that an LED connected in inverse parallel thereto is protected from destruction. For instance, when a surge voltage is loaded between the terminals 84 and 82, if a positive voltage is loaded to the terminal 84, the red LED 20-2 and green LED 22 are set in the forward direction, and a current flows to these LEDs, so that the red LED 20-1 and blue LED 24 are protected from destruction.

When a positive voltage is loaded to the terminal 82, the red LED 20-1 and blue LED 24 are set in the forward direction, and a current flows to these LEDs, so that the red LED 20-2 and green LED 22 are protected from destruction.

What is claimed is:

1. A light emitting diode as a compact light source for a lighting unit, said light emitting diode comprising:
    first, second, and third terminals;
    first and second light emitting diodes connected between the first terminal and the second terminal and also connected in inverse parallel to each other; and
    a third light emitting diode connected between the first or second terminal and the third terminal.

2. The light emitting diode of claim 1, wherein said first diode is a green light emitting diode, said second light emitting diode is a blue light emitting diode, and said light emitting diode is a read light emitting diode.

3. A light emitting diode module as a compact light source for a lighting unit, said light emitting diode module comprising:
    a red light emitting diode having an anode electrode on a top surface thereof and a cathode electrode on a rear surface thereof;
    a green light emitting diode having an anode electrode and a cathode electrode on a top surface thereof;
    a blue light emitting diode having an anode electrode and a cathode electrode on a top surface thereof;
    a first lead frame on which said red light emitting diode and green light emitting diode are provided;
    a second lead frame on which said blue light emitting diode is provided; and
    a third lead frame, wherein an anode electrode of said red light emitting diode is connected via a bonding wire to the third lead frame; a cathode electrode of said green light emitting diode is connected via a bonding wire to the first lead frame and also via a bonding wire to the anode electrode of the blue light emitting diode; an anode electrode of said green light emitting diode is connected via a bonding wire to the cathode electrode of the blue light emitting diode; and a cathode electrode of said blue light emitting diode is connected via a bonding wire to the second lead frame.

4. A light emitting diode module as a compact light source for a lighting unit, said light emitting diode module comprising:
    first, second, and third terminals;
    first and second light emitting diodes connected between the first and third terminals and also connected in inverse parallel to each other; and
    third and fourth light emitting diodes connected between the second and third terminals and also connected in inverse parallel to each other.

5. The light emitting diode module of claim 4, wherein said first light emitting diode is a green light emitting diode, said third light emitting diode is a blue light emitting diode, and second and fourth light emitting diodes are red light emitting diodes.

6. A light emitting diode module as a compact light source for a lighting unit, said light emitting diode module comprising:

first and second red light emitting diode each having an anode electrode on a top surface thereof and a cathode electrode on a rear surface thereof;

a green light emitting diode having an anode electrode and a cathode electrode on a top surface thereof;

a blue light emitting diode having an anode electrode and a cathode electrode on a top surface thereof;

a first lead frame on which said first and second red light emitting diodes are provided;

a second lead frame on which said green light emitting diode is provided; and a third lead frame on which said blue light emitting diode is provided, wherein an anode electrode of said first red light emitting diode is connected via a bonding wire to the second lead frame; an anode electrode of said second red light emitting diode is connected via a bonding wire to the third lead frame; an anode electrode of said green light emitting diode is connected via a bonding wire to the first lead frame with a cathode electrode thereof connected via a bonding wire to the second lead frame; an anode electrode of said second red light emitting diode is connected via a bonding wire to the third lead frame; an node electrode of said blue light emitting diode is connected via a bonding wire to the first lead frame with a cathode electrode thereof connected via a bonding wire to the third lead frame.

* * * * *

UNITED STATES PATENT AND TRADEMARK OFFICE
CERTIFICATE OF CORRECTION

PATENT NO.     : 6,696,784 B2
DATED          : February 24, 2004
INVENTOR(S)    : Minoru Yoshida and Haruo Matsumoto It is certified that error appears in the above-identified patent and that said Letters Patent is hereby corrected as shown below:

Column 1,
Line 51, "many cases an node" should read -- many cases an anode --.
Line 62, "the greed LED" should read -- 36, the green LED --.

Column 5,
Line 52, "the polarity as shown in Table 1" should read -- the polarity as shown in Table 2 --.

Column 8,
Line 14,. "an node" should read -- an anode --.

Signed and Sealed this

Tenth Day of August, 2004

JON W. DUDAS
*Acting Director of the United States Patent and Trademark Office*